US006996754B1

(12) United States Patent
Lee

(10) Patent No.: US 6,996,754 B1
(45) Date of Patent: Feb. 7, 2006

(54) INTEGRATED CIRCUIT DEVICE HAVING AN INTERNAL STATE MONITORING FUNCTION

(75) Inventor: Yun-Sang Lee, Yongin-shi (KR)

(73) Assignee: Samsung Electronics Company Limited, Kyunggi-do (KR)

( * ) Notice: Subject to any disclaimer, the term of this patent is extended or adjusted under 35 U.S.C. 154(b) by 380 days.

(21) Appl. No.: 09/672,223

(22) Filed: Sep. 27, 2000

(30) Foreign Application Priority Data

Sep. 27, 1999 (KR) ................................ 1999-41360

(51) Int. Cl.
*G01R 31/28* (2006.01)

(52) U.S. Cl. ...................................... 714/724; 714/723
(58) Field of Classification Search ................ 714/718, 714/742, 727, 730, 724, 738
See application file for complete search history.

(56) References Cited

U.S. PATENT DOCUMENTS

| 4,144,536 A | * | 3/1979 | Ardezzone et al. ........ 346/33 F |
| 4,875,003 A | * | 10/1989 | Burke ......................... 714/736 |
| 5,396,499 A | * | 3/1995 | Urai .......................... 714/718 |
| 5,463,635 A | * | 10/1995 | Kumazawa et al. ......... 714/718 |
| 5,495,487 A | * | 2/1996 | Whetsel, Jr. ................ 714/736 |
| 5,668,764 A | * | 9/1997 | Surlekar ..................... 365/201 |
| 5,706,235 A | * | 1/1998 | Roohparvar et al. ........ 365/201 |
| 6,016,560 A | * | 1/2000 | Wada et al. ................ 714/718 |
| 6,272,588 B1 | * | 8/2001 | Johnston et al. ............ 711/106 |

\* cited by examiner

*Primary Examiner*—Shelly Chase
*Assistant Examiner*—Mujtaba Chaudry
(74) *Attorney, Agent, or Firm*—Harness, Dickey & Pierce, P.L.C.

(57) ABSTRACT

An integrated circuit device for testing is disclosed. The device includes a plurality of internal circuits for generating a plurality of internal signals, the internal signals used for addressing storage locations and for controlling internal operations, a first selection circuit for receiving the internal circuits in response to selection signals corresponding to test information signals, a second selection circuit for receiving output signals from the first selection circuit and output signals from a sense amplifier, and for opening an alternative one of transfer paths of the internal signals and the output signals in response to the selection signals, and a data output buffer for transferring output signals from the second selection signals to an outside of the device through data input/output pads.

18 Claims, 5 Drawing Sheets

INTEGRATED CIRCUIT DEVICE HAVING AN INTERNAL STATE MONITORING FUNCTION

This application relies for priority upon Korean Patent Application No. 1999-41360, filed on Sep. 27, 1999, the contents of which are herein incorporated by reference in their entirety.

FIELD OF THE INVENTION

The present invention is in the field of a semiconductor integrated circuit device and is more specifically related to a circuitry for monitoring an internal state of an integrated circuit device.

BACKGROUND OF THE INVENTION

A probing equipment employed in testing semiconductor integrated circuits is constructed with a probing card that is a printed circuit board on which very fine needles are fixed. An electrical transmission from an integrated circuit to a test equipment which analyzes electrical information from the integrated circuit is accomplished by contacting the needles to input/output pads of the integrated circuit. Electrical signals for testing are transferred to the test equipment through the probing means.

Otherwise, to perform a test function against internal signals of semiconductor integrated circuit such as dynamic random access memories, static random access memories, and non-volatile memories like read only memories needs a more precise apparatus that is a micro probing equipment. The micro probing equipment checks the internal signals being active in a low frequency and contacts probing needles to test pads through which signal lines in the semiconductor integrated circuit are connected to the test equipment.

However, there are several problems in such a micro probing device. First, the internal signals passing through the signal lines may not be transferred to the probing card or would be distorted from their original forms, because of parasitic loading factors existed in the probing needles, such as resistance, capacitance, and inductance. The second is that an area occupied by test pads is becoming relatively larger in proportion to an increase an integration density of the semiconductor memory devices. The third demerit is that there would easily occur physical damages such as an injury of test pads, or a snap-down of signal lines, because the needles on the probing card move in a tremble or other environments. And, a time for preparing a test system to connect the micro probing apparatus to test equipment is longer than those of other test types, causing an increase of a whole test time. Those problems relevant to the probing apparatus for testing high density semiconductor memory devices are not helpful in promoting fail analysis and development of semiconductor integrated circuit devices, thereby resulting in a degradation of manufacturing yield with them.

SUMMARY OF THE INVENTION

The present invention is intended to solve the problems. And, it is an object of the invention to provide an integrated circuit device capable of a test operation without using a probing device or pads exclusively used for the test operation.

It is another object of the invention to provide an internal state monitoring circuit capable of enhancing reliability and efficiency for testing in a high density semiconductor integrated circuit device.

It is another object of the invention to provide an integrated circuit device having an internal state monitoring function without using a probing device or test pads.

It is another object of the invention to provide a method for monitoring internal states in a high density semiconductor integrated circuit device without using a probing device or test pads for testing.

In order to accomplish those objects, an integrated circuit device of the invention employs a selection circuit for controlling transfer paths of the internal signals and data from a sense amplifier, in response to selection signals. The selection signals correspond to test information signals. The internal signals passing through the selection circuit are transferred to an outside of the device through a data output buffer and input/output pads. The invention makes an integrated circuit device be on need of using a probing apparatus and additional pads exclusive for testing.

It is preferred that an practical configuration of the integrated circuit device includes: a plurality of internal circuits for generating a plurality of internal signals, the internal signals used for addressing storage locations and for controlling internal operations; a first selection circuit for receiving the internal circuits in response to selection signals corresponding to test information signals; a second selection circuit for receiving output signals from the first selection circuit and output signals from a sense amplifier, and for opening an alternative one of transfer paths of the internal signals and the output signals in response to the selection signals; and a data output buffer for transferring output signals from the second selection signals to an outside of the device through data input/output pads.

In monitoring internal signals in the integrated circuit device having sense amplifier, a data output buffer, and input/output pads, the sequential steps are performed by (1) detecting a test mode in response to a logical states with external control signals of the integrated circuit device; (2) selecting a part of internal signals of the integrated circuit device in response to selection signals corresponding to test information signals; (3) selecting an alternative one of transfer paths of the part of the internal signals and output signals from the sense amplifier in response to the selection signals; and (4) transferring the part of the internal signals to an outside of the integrated circuit device through the data output buffer and the input/output pads.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the drawings referred to the present specification, the identical reference numerals denote the same or corresponding parts. And, the signals whose reference numerals has a suffix "B" is active in negative logic.

DETAILED DESCRIPTION OF PREFERRED EMBODIMENTS

Hereinbelow, applicable embodiments of the invention will be as follows, with the appended drawings. The present invention is embodied into a high density DRAM as an example.

Figure 1:
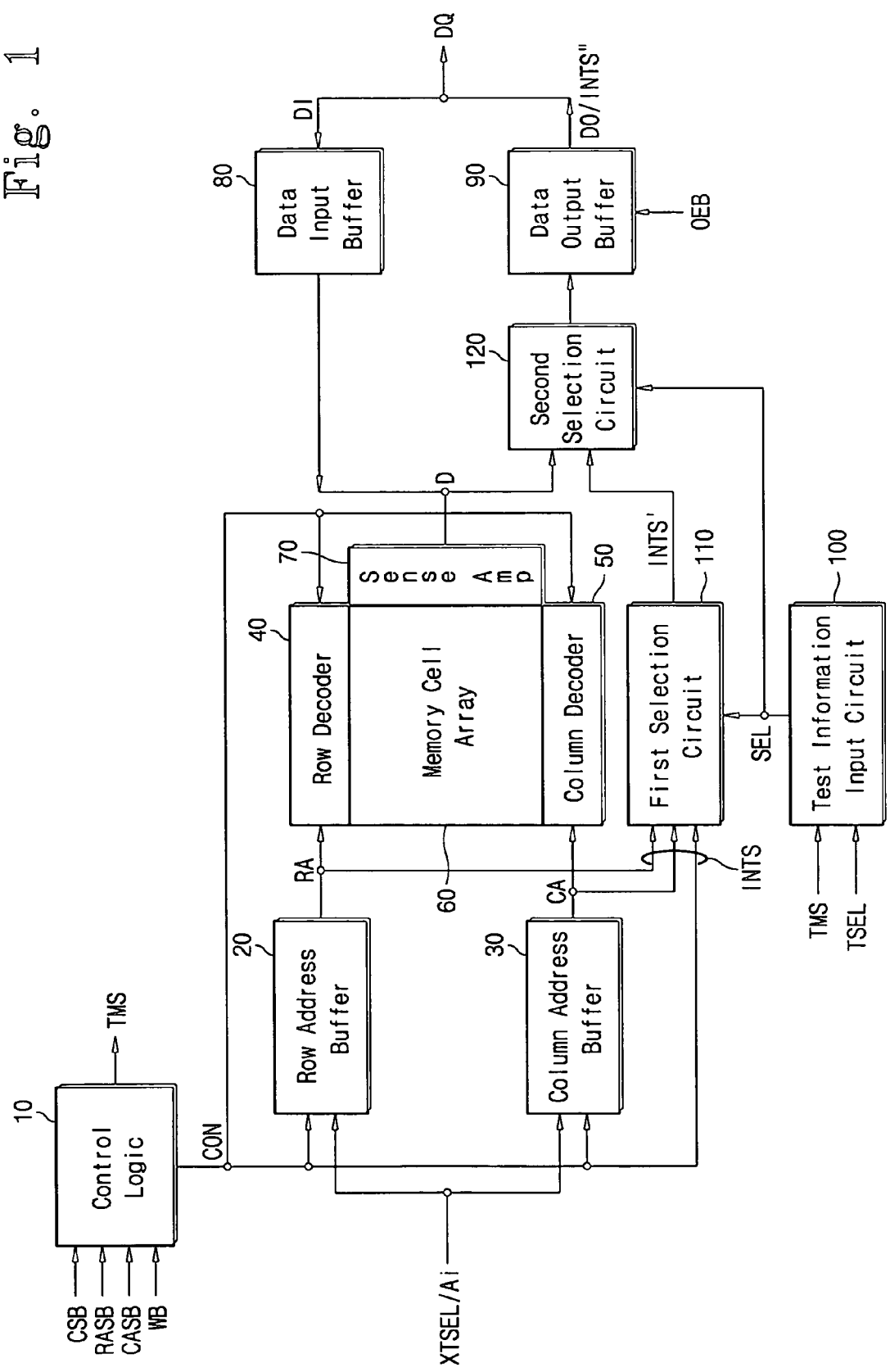
FIG. 1 is a block diagram of a semiconductor memory device employing an internal state monitoring function according to a preferred embodiment of the invention.

Referring to FIG. 1, a semiconductor integrated circuit associated to the present invention includes control logic block 10, data output buffer 90, test information input circuit 100, first selection circuit 110, and second selection circuit 120. Control logic block 10 generates test mode signal TMS in response to signals CSB, RASB, CASB, and WB those are control signals normally used in a DRAM. Test information input circuit 100 receives internal test information signals TSEL from address buffers, 20 and 30, and then generates plural selection signals SEL0~SELn-1 corresponding to test information signals TSEL in response to test mode signal TMS. First selection circuit 110 selects transmission paths of first-stage internal signals INTS that are generated from internal circuit in the semiconductor integrated circuit, and makes a part of the internal signals INTS be transferred into the second selection circuit 120. Second selection circuit 120 applies one of the internal signals from first selection circuit 110 and data signals from the internal circuits to data output buffer 90, corresponding to the selection signals SEL0~SELn-1. Data output buffer 90 transfers data from sense amplifier 70 to input/output pads DQ during a normal operation mode, or transfers signals from the second selection circuit 120 receiving second-stage internal signals INTS' from first selection circuit 110 to input/output pads during a test mode. Row address buffer 20 and column address buffer 30 receives address signals Ai during the normal operation mode, while receiving external test information signals XTESL during the test mode. Row decoder 40 generates decoded row address signals DRA from the row address signals RA of the row address buffer 20 for the normal and test modes. Column decoder 50 generates decoded column address signals DCA from the column address signals CA of the column address buffer 30 for the normal and test modes.

Memory cell array 60 includes a plurality of memory cells coupled to a plurality of wordlines and bitlines. The memory cells store data D during the normal and test modes. Sense amplifier 70 transfers data supplied from data input buffer 80 into memory cell array 60, and transfers data stored in memory cell array 60 to data output buffer 90. It should be understood that the internal signals INTS includes a multiplicity of signals in addition to row address signals RA, column address signals CA, control signals CON, and decoded address signals DRA and DCA.

Figure 2:
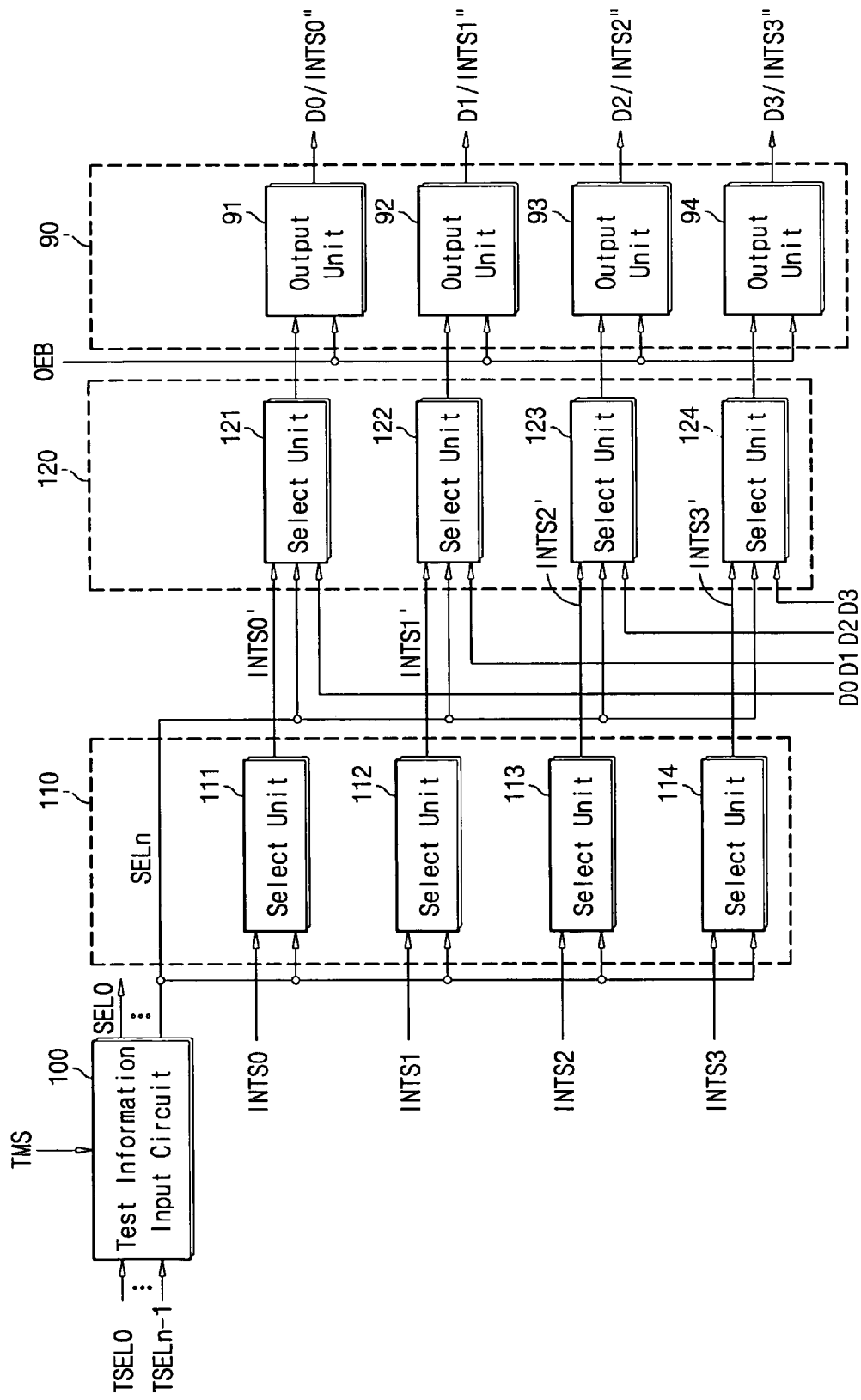
FIG. 2 shows an architecture of the internal state monitoring circuit shown in FIG. 1.

FIG. 2 shows a interconnecting features between first selection circuit 110, second selection circuit 120, and data output buffer 90. First selection circuit is formed of a plurality of groups each of which consists of selection units 111~114 which receive first-stage internal signals INTS0~INTS3, and generates second-stage internal signals INTS0'~INTS3', respectively. One of the selection unit groups is corresponding to one of selection signals SEL0~SELn-1 generated from test information input circuit 100. In FIG. 2, selection units 111~114 is n'th group and controlled by n'th selection signal SELn in common. Second selection circuit 120 is formed of a plurality of groups each of which consists of selection units 121~124 which receive second-stage internal signals INTS0'~INTS3' from first selection circuit 110, respectively. And, data bits D0~D3 from the sense amplifier 70 applied to selection units 121~124, respectively. As the first selection circuit does, selection units 121~124 is n'th group and controlled by n'th selection signal SELn-1 in common. Corresponding to the arrangement in first selection circuit 110 and second selection circuit 120, data output buffer 90 has a plurality of groups each of which consists of data output units 91~94 that receive signals from second selection circuit 120 and transfer data bits D0~D3 and third-stage internal signals INTS0"~INTS3" to the input/output pads, in response to output enable signal OEB, respectively.

Figure 3:
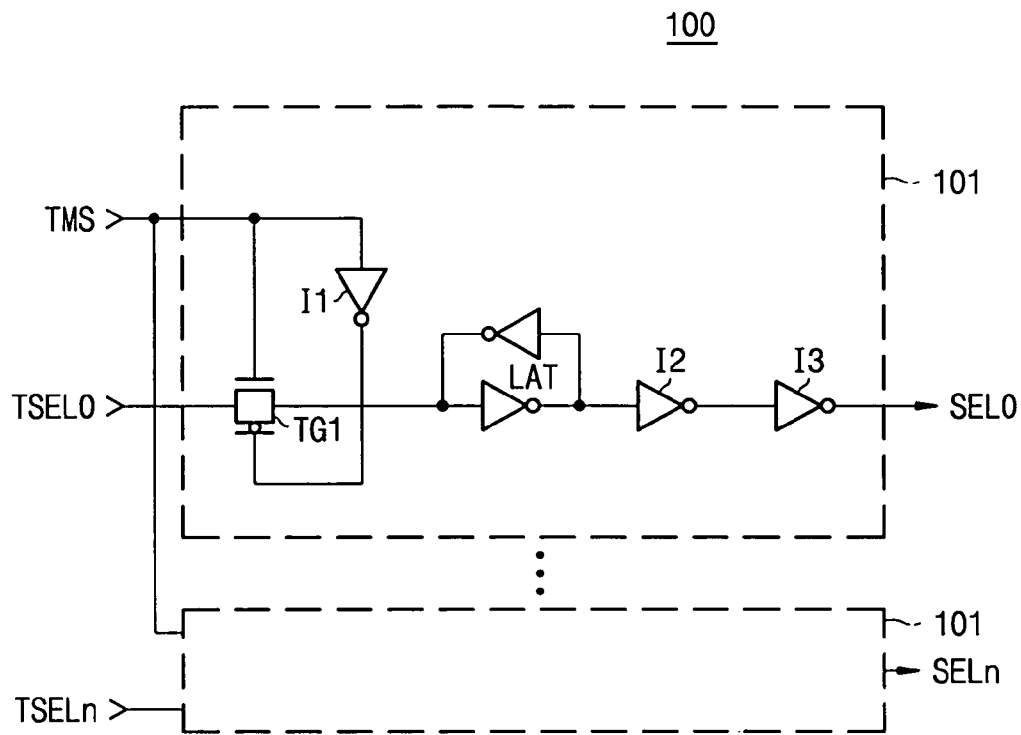
FIG. 3 is a circuit diagram of a test information input circuit.

Test information input circuit 100, referring to FIG. 3, is formed of a plurality of test information storage units 101 each receiving a plurality of test information signals TSEL0~TSELn-1 and generating a plurality of selection signals SEL0~SELn-1. Each of storage units 101 has CMOS transmission gate TG1, latch LAT, and inverters I1~I3. Transmission gate TG controlled by test mode signal TMS. TSEL0 is applied to latch LAT through transmission gate TG1 when TMS is high level. The output of latch LAT is generated as selection signal SEL0 through inverters I2 and I3 connected in serial.

Figure 4:
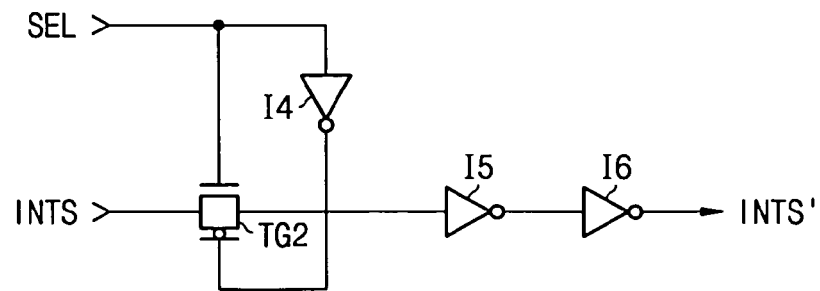
FIG. 4 is a circuit diagram of a first selection circuit shown in FIG. 2.
Figure 5:
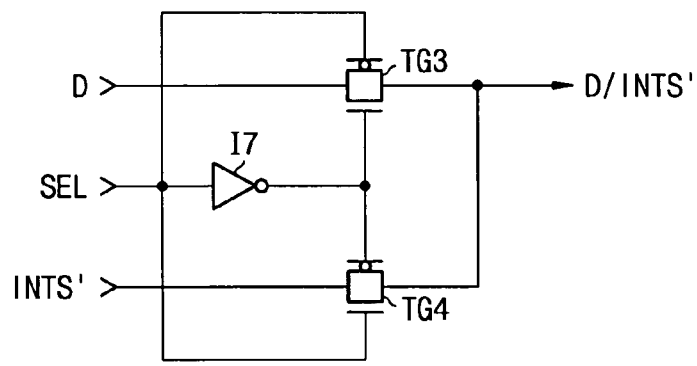
FIG. 5 is a circuit diagram of a second selection circuit shown in FIG. 2.

Selection unit 111, 112, 113, or 114, of first selection circuit 110, referring to FIG. 4, is formed of transmission gate TG2 and inverters I4~I6. Transmission gate TG2 is controlled by selection signal SEL. First-stage internal signal INTS passes through transmission gate TG2 when selection signal SEL is high level, and generated as second-stage internal signal INTS' through inverters I5 and I6 connected in serial. Selection unit 121, 122, 123, or 124, of second selection circuit 120, referring to FIG. 5, includes two transmission gates TG3 and TG4 which are controlled by selection signal SEL. Transmission gates TG3 and TG4 pass data bit D from the sense amplifier and second-stage internal signal INTS', respectively, in response to selection signal SEL. Transmission gates TG3 and TG4 are turned on when selection signal SEL is low and high levels, respectively.

Figure 6:
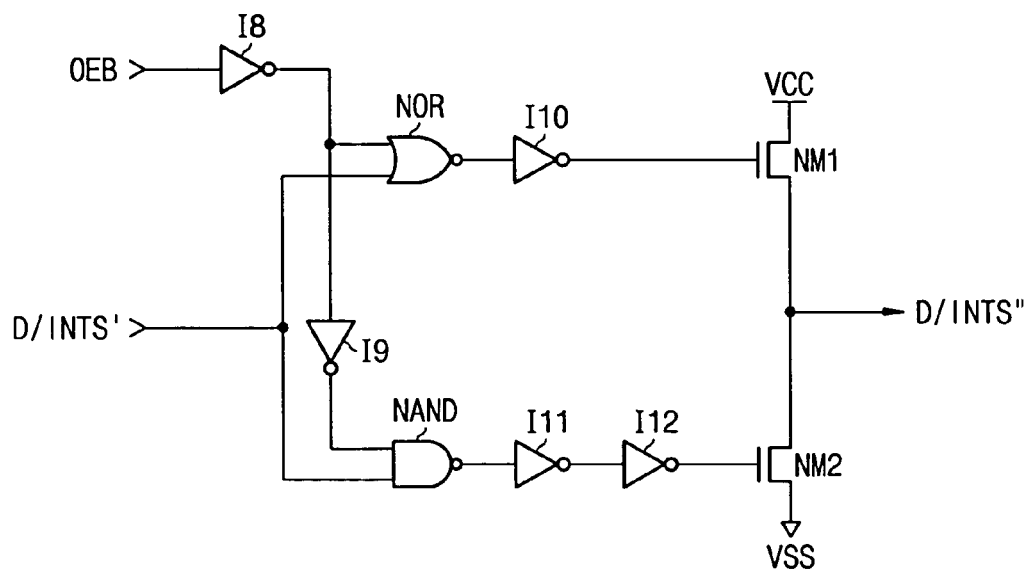
FIG. 6 is a circuit diagram of a data output buffer shown in FIG. 2.

Referring to FIG. 6, in data output unit 91, 92, 93, or 94, of data output buffer 90, data bit D or second stage internal signal INTS' supplied from second selection circuit 120 is applied to inputs of NOR and NAND gates which are controlled by output enable signal OEB. Outputs from the NOR and NAND gates are applied to gates of output transistors NM1 and NM2 through inverter I10 and serial-connected inverters I11 and I12, respectively. Alternative one of data bit D and internal signal INTS", corresponding to the input of the data output unit, is generated at a node between output transistors NM1 and NM2.

Figure 7:
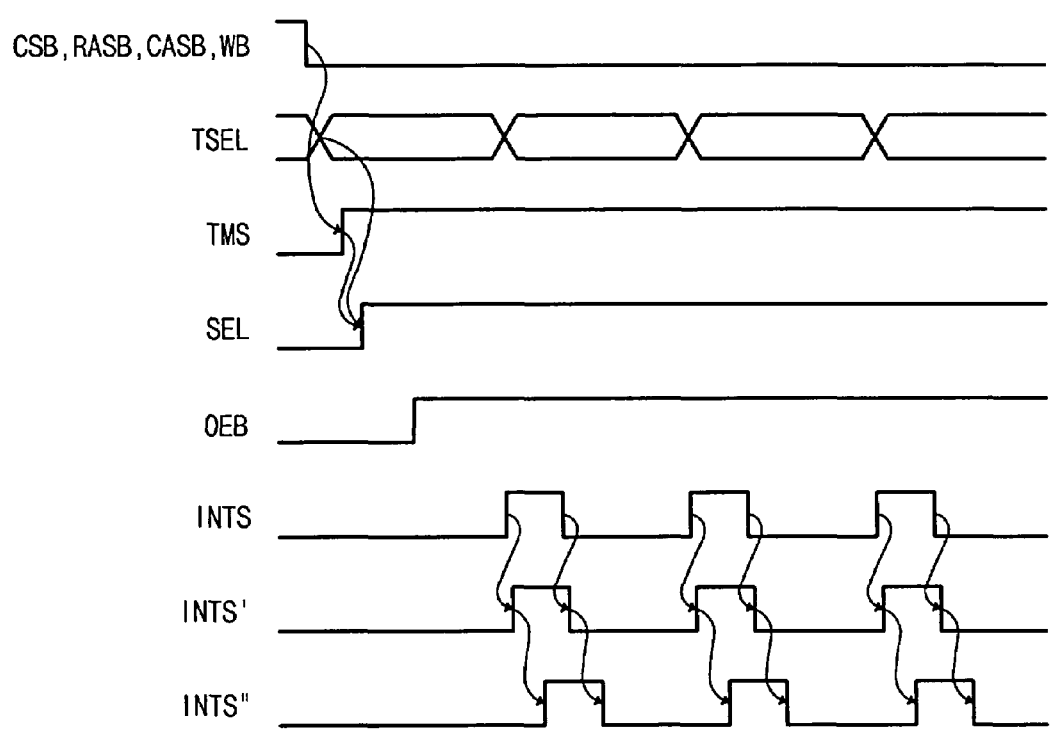
FIG. 7 is a timing diagram showing an operation for monitoring an internal state of the semiconductor memory device.

Now, an explanation about an operation in the test mode will be given in conjunction with the timing chart of FIG. 7. The DRAM shown in FIG. 1 has a normal operation mode and a test operation mode. An operation of the normal mode will be described ahead of an explanation relevant to the test mode.

The normal mode is divided into a writing operation and a reading operation. First, in the writing operation, address signals Ai are applied to row and column address buffers, 20 and 30, in response to row address strobe signal RASB and column address strobe signal CASB, respectively. Address buffers 20 and 30 generate row address signals RA and column address signals CA, and apply them to row decoder 40 and column decoder 50, respectively. When write enable signal WEB is enabled, input data supplied through data input buffer 80 are applied to sense amplifier 70. Row decoder 40 and column decoder 50 generate decoded row and column address signals, DRA and DCA, respectively, in order to activate corresponding wordlines and bitlines in memory cell array 60. Then, the input data passing through sense amplifier 70 are stored in memory cells selected by the row and column addresses.

In the reading operation, after completing an addressing sequence for memory cells in memory cell array 60 as the writing operation does, data stored in selected memory cells are transferred into corresponding bitlines by sharing charges therebetween. Then, sense amplifier 70 detects voltages on the bitlines and transfers the sensed data to data output buffer 90 through second selection circuit 120. Second selection circuit 120, referring to FIG. 5, opens paths for the data from sense amplifier 70 while blocks paths for the internal signals because selection signals SEL are low levels. Data output buffer 90 transfers the data from sense amplifier 70 to the outside of the DRAM in response to output enable signal OEB.

The test operation is performed throughout several sequence steps of detecting a test mode, selecting a part of the internal signals in response to test mode signal TMS, and transferring the selected internal signals to the outside of the DRAM chip, as follows.

The test operation initiates when test mode signal TMS is enabled to high level in response all to the activated control signals, CSB, RASB, CASB, and WB, with low levels. Test mode signal TMS is applied to test information input circuit 100. Then, external test information signals XTSEL are converted into internal test information signals TSEL, with CMOS levels, through row and column address buffers, 20 and 30. TSEL are applied to test information input circuit 100. Test information input circuit 100 store the test information signals in latches LAT in response to the high-leveled test mode signal TMS, as shown in FIG. 3, and generates selection signals SEL (SEL0~SELn-1) corresponding to test information signals TSEL. Selection signals SEL are applied to first and second selection circuits, 110 and 120.

And, next, first selection circuit 110 transfers a part of first-stage internal signals INTS (including row address signals RA, column address signals CA, control signals CON, decoded address signals, DRA and DCA, and et al.) into second-stage internal signals INTS', in response to selection signals SEL. Assuming that, in FIGS. 2 and 4, internal signals INTS0~INTS3 are each RA, CA, CON, and DRA (referred to as RA~DRA), and selection signal SELn-1 are active with high levels, the four bits of the RA~DRA among all the internal signals applied to first selection circuit 110 will be transferred to as second-stage internal signals INTS' (INTS0'~INTS3', or RA'~DRA') applied to second selection circuit 120. Since selection signals SELn-1 are high levels, the internal signals RA~DRA selected through first selection circuit 110 are transferred to data output buffer 90 through second selection circuit 120. During that time, in the selection units responding to SELn-1 in second selection circuit 120, referring to FIG. 5, transmission gate TG3 is shut off while transmission gate TG4 is turned on.

In data output buffer 90, the internal signals RA~DRA selected through first and second selection circuits, 110 and 120, are driven in their corresponding data output units (e.g., 91~94) and transferred to the outside of the DRAM chip as third-stage internal signals (i.e., finally test output signals to be monitored) through input/output pads DQ. The internal signals from input/output pads DQ are analyzed in a test device.

As described above, the present invention offers significant advantages over conventional art, in which the internal signals generated within the integrated memory circuit device (e.g., DRAM) are transferred to the outside of the integrated circuit device through the data output buffer and input/output pads those are also used in a normal operation mode, so that there are no needs for preparing additional pads only exclusive to a test operation and a probing apparatus. Therefore, the integrated circuit device would be free from a burden of increased pads for testing, and from a degradation of test reliability with signal transmission due to the parasitic noise components and the physical damages. Furthermore, the invention can reduce a testing time because of no preparing an interconnection between an integrated device and the probing apparatus.

While this invention has been described in connection with what is presently considered to be the most practical and preferred embodiment, specifically in a DRAM, it is to be understood that the invention is not limited to the disclosed embodiment. Since other integrated circuit memory devices but the DRAM utilizes a multiplicity of internal signals including address signals, control signals, and et al, the monitoring configuration with the selection circuits and the data output buffers that is basically employed in all the memory devices would be arranged for testing by those skilled in this art. And, it is intended to cover various modifications and equivalent arrangements included within the scope of the invention.

What is claimed is:

1. An integrated circuit device comprising:
    a plurality of internal circuits for generating a plurality of internal signals, the internal signals used for addressing storage locations and for controlling internal operations;
    a first selection circuit for receiving the internal signals in response to selection signals corresponding to test information signals;
    a second selection circuit for receiving output signals from the first selection circuit and output signals from a sense amplifier, and for opening an alternative one of transfer paths for the internal signals and the output signals of the sense amplifier in response to the selection signals; and
    a data output buffer for transferring output signals from the second selection signals externally from the integrated circuit device through data input/output pads, the data input/output pads being shared by the internal signals and the output signals from the sense amplifier.

2. The device of claim 1 wherein the internal signals include row information, column information, and control information.

3. The device of claim 1 further comprising:
    a test information input circuit configured to send the selection signals to the selection circuit.

4. The device of claim 3 wherein the test information input circuit is configured to generate the selection signals in correspondence to the test information signals and a test mode signal.

5. The device of claim 3 wherein the test mode signal is in response to dynamic random access memory control information.

6. A method for monitoring internal signals in an integrated circuit device having input/output pads, the method comprising the steps of:
  detecting a test mode;
  selecting a part of internal signals of the integrated circuit device in response to selection signals, the internal signals used for addressing storage locations and for controlling internal operations;
  selecting an alternative one of transfer paths of the part of the internal signals and output signals from the integrated circuit device in response to the selection signals; and
  transferring the part of the internal signals external to the integrated circuit device.

7. The method of claim 6 wherein the selecting is based on the detected test mode.

8. The method of claim 6 wherein the detecting is based on dynamic random access memory control information.

9. The device of claim 6 wherein the internal signals include row information, column information, and control information.

10. A method for monitoring internal signals in an integrated circuit device having sense amplifier, a data output buffer, and input/output pads, the method comprising:
  detecting a test mode in response to a logical states with external control signals of the integrated circuit device;
  selecting a part of internal signals of the integrated circuit device in response to selection signals corresponding to test information signals;
  selecting an alternative one of transfer paths of the part of the internal signals and output signals from the sense amplifier in response to the selection signals, the internal signals used for addressing storage locations and for controlling internal operations; and
  transferring the part of the internal signals external to the integrated circuit device through the data output buffer and the input/output pads, the data input/output pads being shared by the internal signals and the output signals.

11. The method of claim 10 wherein the selection signals also correspond to detected test mode information.

12. The method of claim 10 wherein the logical states are based on dynamic random access memory control information.

13. The method of claim 10 wherein the internal signals include row information, column information, and control information.

14. A semiconductor memory device, comprising:
  a test detector circuit configured to generate a test signal in response to external control signals; a selection signal generator circuit configured to receive an address selection signals in response to the test signal and to generate section signals;
  a first selection circuit configured to select internally generated signals in response to the selection signals;
  a second selection circuit configured to select either data read out from memory cells or an output of the first selector circuit in response to the selection signals; and
  an output buffer circuit configured to output an output of the second selector circuit to the outside.

15. The device of claim 14 wherein the internal signals include row information, column information, and control information.

16. The device of claim 14 further comprising:
  a test information input circuit configured to send the selection signals to the selection circuit.

17. The device of claim 16 wherein the test information input circuit is configured to generate the selection signals in correspondence to the test information signals and a test mode signal.

18. The device of claim 17 wherein the test mode signal is in response to dynamic random access memory control information.

* * * * *